March 19, 1968 H. H. SANDER 3,374,408

TRANSISTOR HAVING CONSTANT GAIN OVER A BROAD TEMPERATURE RANGE

Filed May 21, 1965 2 Sheets-Sheet 1

INVENTOR.
Howard H. Sander
BY
[signature]
Attorney

INVENTOR.
Howard H. Sander
BY
Roland G. Anderson
Attorney

United States Patent Office 3,374,408

Patented Mar. 19, 1968

3,374,408

TRANSISTOR HAVING CONSTANT GAIN OVER A BROAD TEMPERATURE RANGE

Howard H. Sander, Albuquerque, N. Mex., assignor, by mesne assignments, to the United States of America as represented by the United States Atomic Energy Commission Filed May 21, 1965, Ser. No. 457,880

4 Claims. (Cl. 317—235)

This invention is generally concerned with an improvement in transistor current gain characteristics. More particularly, it relates to transistors capable of operating with substantially constant current gain over a broad temperature range, and to a method for modifying existing transistors to achieve this capability.

The current gain of nearly all transistors is known to fall with decrease in temperature from a high point at somewhat above 300° K, i.e., room temperature, usually dropping to near zero gain at approximately the range of 80° K.–100° K. and remaining near zero as temperature is further reduced. This inherent weakness of transistors has necessitated the incorporation in transistorized amplifiers of costly temperature compensating circuits or feedback networks in order to maintain current gain at an acceptable level with temperature variation. A study of available scientific literature dealing with this suubject reveals that this characteristic drop in gain with decreasing temperature has inhibited careful investigation of the possible amplification characteristics of specific transistor types at extremely low temperatures. The basis of the present invention is the discovery of an important low temperature current gain anomaly which exists in transistors having certain constituents. For these transistors, as the temperature is decreased from room temperature, the current gain decreases steadily in the customary manner until a low value or "valley point" is reached near a temperature of about 135° K. after which the gain then begins to increase as temperature is decreased further. The gain reaches a maximum or low temperature peak at approximately the temperature of liquid nitrogen or about 76° K., and then decreases again steadily toward zero as temperature is reduced further. In the detailed description to follow, this current gain-versus-temperature characteristic will be illustrated for several specific transistors. The magnitude of this low temperature gain peak is slightly dependent on the level of operating collector current and varies among those specific transistors which exhibit the phenomenon, but where it is present this peak is large and unmistakable. This anomaly has been observed to occur thus far for n-p-n silion transistors but it is believed that further investigation may reveal its presence additionally in p-n-p types and in germanium transistors.

A further important discovery is that the transistors displaying the above described anomaly or low temperature current gain characteristic have a markedly increased tolerance to nuclear irradiation in the vicinity of the low peak temperature as compared to room temperature and other intermediate temperatures. Normally the current gain of a transistor is degraded rapidly in the presence of nuclear irradiation and at levels on the order of $1.0\times10^{14}$ n/cm.$^2$ (neutrons per square centimeter) may be virtually destroyed. For example, in specific cases under such irradiation the anomalous transistors retained less than 9% of their original gain value. Surprisingly, this extensive degradation in gain due to nuclear irradiation does not occur in the vicinity of the low peak temperature for transistor types exhibiting the anomaly. For example, at about 76° K. the same anomalous transistors retained in the neighborhood of 50% of their non-irradiated current gain at irradiation levels of about $1.0\times10^{14}$ n/cm.$^2$. Illustration will be provided later of specific instances of the occurrence of this low temperature tolerance to nuclear irradiation.

The basic discoveries outlined above had led to the development of transistors having essentially constant current gain over a broad temperature range. This has been achieved by the application to transistors exhibiting the low temperature peak phenomenon of selected levels of neutron irradiation and operating the resulting transistors at specified current levels, thereby achieving hitherto unobtainable characteristics.

It is therefore a general object of the present invention to devise transistors which under proper conditions of operation will exhibit a substantially constant current gain over a broad temperature range.

It is a further object of this invention to provide means for rendering transistorized circuits highly radiation tolerant when operated at very low temperatures.

It is a still further object of this invention to modify the current gain characteristics of various transistor types by subjecting them to specified levels of nuclear irradiation.

It is yet another object of this invention to provide a transistor which exhibits gain only in the vicinity of one narrow temperature range.

Further objectives and advantages of the present invention will become more apparent from the detailed description that follows taken in conjunction with the attached drawings, in which.

Figure 1:
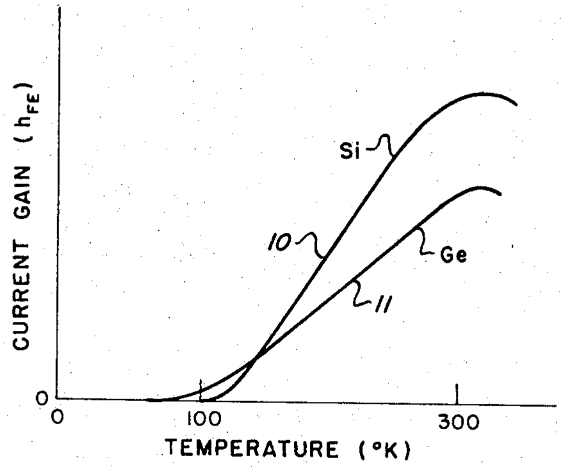
FIG. 1 is a chart illustrating typical current gain-versus-temperature characteristics for usual silicon and germanium transistors.

With reference now to FIG. 1, there is observed a current gain-versus-temperature characteristic 10 for a typical silicon n-p-n transistor and a corresponding current gain characteristic 11 for a similar germanium transistor showing a high value at somewhat above 300° K., falling off to near zero gain at approximately 80° K. to 100° K. In FIG. 1, as well as in subsequent figures, current gain $$h_{FE}=\frac{I_c}{I_b}$$

where $I_c$ is collector current and $I_b$ is base current. These curves were plotted for D.C. current gain. The corresponding curves for A.C. current gain would be essentially the same although they may differ slightly in magnitude. It should be carefully noted that the values of current gain decrease *steadily* with decreasing temperature.

Figure 2:
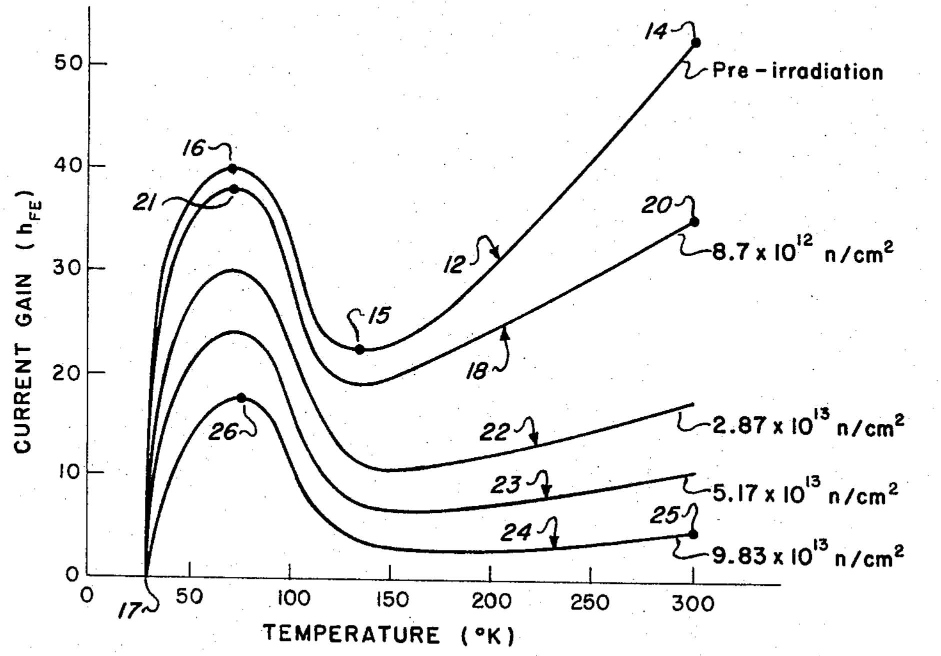
FIG. 2 illustrates a family of current gain-versus-temperature characteristics at different radiation levels for a transistor exhibiting the low temperature anomaly.

Turning to FIG. 2, an actual plot is shown of current gain $h_{FE}$ versus temperature in degrees Kelvin at various levels of neutron irradiation for a transistor exhibiting the low temperature anomaly, specifically, an n-p-n silicon type having a gallium doped p-region. This irradiation is understood to be with so-called "epithermal neutrons" in order to define the energy content. The curves have been plotted from an arbitrary upper limit of 300° K. since the range below room temperature is of primary concern in this invention. Note first the preradiation curve 12 which exhibits at point 14 a high value at approximately 300° K., decreases to a "valley" at point 15, then begins to increase as temperature is further decreased, reaching a low temperature peak at point 16 where the temperature is in the neighborhood of 76° K., falling rapidly thereafter to near zero gain at point 17. It will be noted also that as increasing levels of neutron irradiation are applied to this transistor, the current gain characteristics are affected differently at different temperature levels, although both the high point at 300° K. and the peak at 76° K. are degraded. For example, for curve 18, at which the radiation level is $8.7 \times 10^{12}$ n/cm.$^2$, the current gain at room temperature, point 20, has been degraded to a much greater extent from its pre-radiation level than has the current gain at the low peak temperature, point 21. As increasingly high levels of radiation are applied, as seen in characteristics 22, 23 and 24, it is observed that the 300° K. current gain has become severely degraded while current gain peak at the low temperature of about 76° K. maintains a substantial portion of its pre-radiation level. For example, at a nuclear radiation level of $9.83 \times 10^{13}$ n/cm.$^2$, the 300° K. current gain at point 25 has fallen to approximately 9% of its pre-radiation level whereas the gain peak at point 26 is still approximately 44% of its original value. The empirical data illustrated in FIG. 2 may be developed by holding either $I_c$ or $I_b$ constant with change in temperature, although it is easier to measure $I_c$ since it is a higher value and therefore the required instrumentation need not be as sensitive. This data clearly establishes two discoveries of great significance, namely, the existence, hitherto unsuspected, of a low temperature gain peak in the vicinity of 76° K. in the current gain-versus-temperature characteristic of specific transistor types and, secondly, the collateral discovery the gain in this low temperature region for transistors exhibiting the anomaly is much more radiation tolerant than at any other temperature levels.

Figure 3:
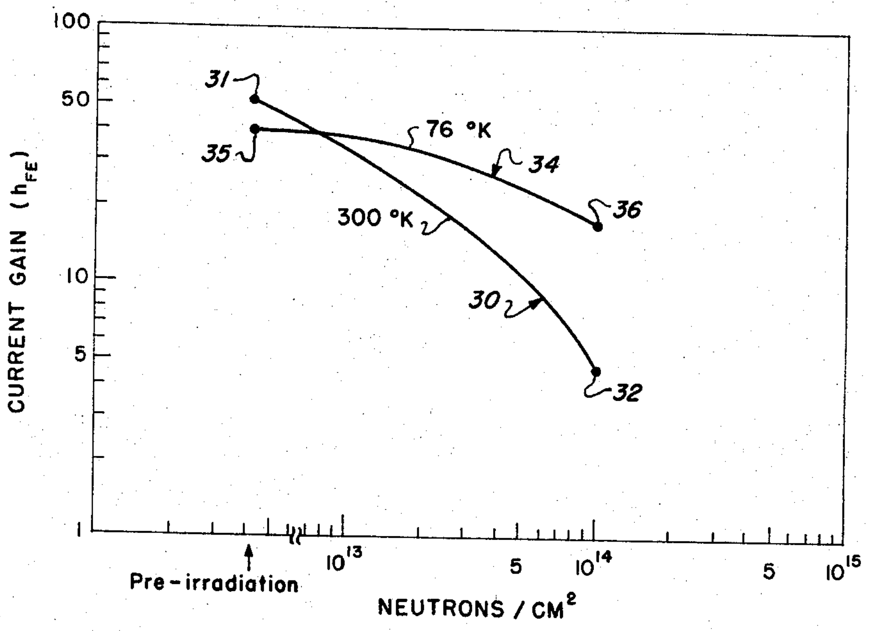
FIG. 3 shows current gain versus neutron irradiation level for a transistor exhibiting the low temperature anomaly.

A different view of the characteristics exhibited in FIG. 2 is shown in FIG. 3 to aid in an understanding of the effect of irradiation on current gain at different temperatures. Current gain versus neutron irradiation level is plotted in logarithmic scale. Curve 30 illustrates the rapid degradation in current gain at 300° K. beginning with a current gain value of about 50 at pre-irradiation point 31 down to a gain of about 5 at an irradiation level of $10^{14}$ n/cm.$^2$ at point 32. Similarly, curve 34 for 76° K. illustrates a pre-irradiation current gain of 40 at point 35 degrading to approximately 20 at the neutron irradiation level of $10^{14}$ n/cm.$^2$ at point 36, again showing by contrast maintenance of nearly half of the pre-irradiation level.

At the present status of experimentation the mechanism whereby a transistor acquires the low temperature gain characteristic which forms the basis for this invention is not fully understood. It is believed, however, that it may depend upon the diffusion to certain levels of certain doping materials or combinations of materials. A large number of different transistor types have been tested. The transistors presently found to exhibit the anomaly are of the so-called n-p-n type having a silicon base n-type region, a gallium doped p-region, and probably a phosphorous emitter n-type region. Examples of these are type WE 2N1051 n-p-n silicon, WE 2N1072 n-p-n silicon, WE 2N1841 n-p-n silicon, WE 2N1675 n-p-n silicon, Fairchild 2N697 n-p-n silicon, Raytheon 2N1468 n-p-n silicon, and T.I. 2N780 n-p-n silicon. The fact that for two transistors of the same type but of different manufacture one may exhibit the phenomenon and the other may not suggests that very sensitive effects are involved.

Figure 4:
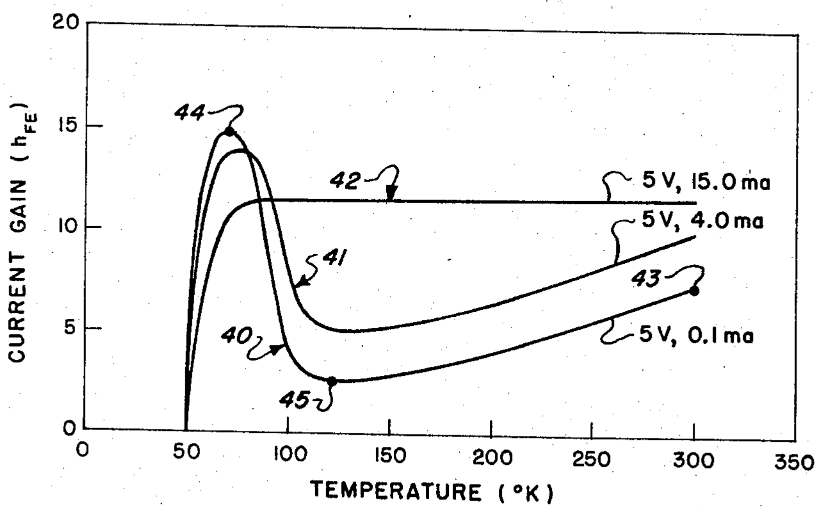
FIG. 4 shows a family of current gain-versus-temperature characteristics for an irradiated transistor exhibiting the low temperature anomaly, operated at various levels of collector current.

In FIG. 4, the anomalous low temperature gain characteristic is again observed but this time a fixed level of neutron irradiation, here, for example, $5 \times 10^{13}$ n/cm.$^2$, has been delivered and a family of characteristics 40, 41 and 42 are generated as the collector current at which the transistor is operated is increased from 0.1 ma. at 5 volts to 15.0 ma. at 5 volts. Note in curve 40 that due to the selected level of neutron irradiation the current gain at room temperature at point 43 has been reduced to a level substantially below the low temperature gain peak at point 44. As now the collector current is increased, the "valley" current gain at point 45 "fills" rapidly so that coupled with a slight decrease in gain at the low peak temperature and a gradual increase in gain over the remaining temperature range to about 300° K., the resultant characteristic 42 becomes substantially flat from the low peak temperature to the vicinity of 300° K.

In a practical situation an n-p-n silicon transistor exhibiting the low temperature gain peak may be selected such that the desirable operating point for an amplifying circuit employing the transistor and the corresponding transistor collector current are known. After irradiation of this transistor for test purposes to a level at which substantial gain degradation occurs, the current gain at the prescribed collector current may experience an increase during the excursion from the vicinity of 76° K. to approximately 300° K. In that event the indicated procedure is to increase the level of irradiation until the current gain is held substantially constant over this temperature range. If, on the other hand, for a given a irradiation level the current gain at the desired level of collector current exhibits a decrease with increasing temperature, a lower level of irradiation should be applied (obviously to a new transistor since this irradiation process is irreversible) until the gain again becomes substantially constant over the desired temperature range.

It is now apparent that a method has been developed for making practical use of the basic discovery of the low temperature transistor anomaly. The heart of this method is the judicious combination of irradiation level as applied to a transistor of the preferred type together with an operating collector current of proper value. As seen in FIG. 4, it is possible through application of increasing levels of irradiation to provide a current gain at low levels of collector current to establish a low temperature gain peak which exceeds the high point, which for most transistors occurs at slightly about 300° K. by any predetermined percentage. Armed with the knowledge that an increase in collector current (within the operating range of the transistor) will *decrease* the magnitude of the low temperature gain peak and *increase* the gain at all other temperatures, one can select a value of collector current at which the values of the low temperature gain peak, the valley point, and the high point are approaching equality. The value of substantially flat gain which can be achieved over the range of approximately 76° K. to slightly about 300° K. will vary depending upon the particular type of transistor employed but the method remains the same. It should be emphasized that while the low temperature gain anomaly appears to be an inherent property of transistors having certain constituents, their gain-versus-temperature characteristics have been affected in a manner not yet understood through the application of varying levels of irradiation. One of the significant aspects of this invention is that nuclear irradiation which hitherto has been regarded as detrimental to the gain characteristics of a transistor, now becomes an essential step in generating improvement therein.

It is clear that any circuit which depends for its signal amplification on the current gain of one or more transistors will normally be rendered useless under severe neutron irradiation since transistors are by far the least tolerant to nuclear irradiation of any circuit component. With the discoveries set forth herein, it is clearly possible by operating such circuits in the vicinity of 76° K. that the susceptibility to neutron irradiation may be substantially reduced. An incidental advantage of such low temperature operation is the reduction in thermal noise.

Since under severe neutron irradiation the transistor gain at all tempertaures other than the specific low temperature at which the anomaly occurs is virtually destroyed, it is clear that this irradiation alone produces a device with "built in" gain, capable for use, for example, to sense the temperature of liquid nitrogen.

It is surmised that a further understanding of the mechanism of the low temperature gain peak characteristic may permit the development of transistor types which exhibit the characteristic at other temperatures than the vicinity of 76° K. to enable radiation tolerant circuitry dependent only upon maintenance of the proper operating temperature.

It is further surmised that the improvements described above together with the transistor anomaly on which they are based will find application not only to the specific transistor types discussed but also to other semiconductive devices and to so-called "integrated" circuits formed by various means such as vapor deposition and the like.

Those skilled in the technology of transistors will have no difficulty in appreciating additional advantages and modes of application of the devices described herein. Reference to specific transistor types, irradiation levels, and operating current levels are to be understood to be illustrative only and in no sense in the nature of limitation on the scope of the invention described.

What is claimed is:

1. In an amplifying circuit employing as its signal amplification means an n-p-n silicon transistor, the method of achieving substantially constant current gain over a range of operating temperature from about 300° K. to about 76° K. consisting in the steps of:

(1) selecting as said signal amplification means a transistor of the type described whose current gain, in a non-irriadiated state, decreases with decreasing operating temperature from a high point at about 300° K. to a valley point at about 135° K., thereafter increases to a gain peak point at about 76° K. and thereafter decreases toward zero;

(2) irradiating said transistor to a predetermined level; and (3) thereafter adjusting the operating collector current of said circuit until the values of current gain at said low temperature gain peak point, said valley point, and said high point are substantially equal.

2. The method of claim 1 wherein the p-region of said transistor is diffused with gallium.

3. In an amplifying circuit adapted to exhibit a substantially constant current gain at a preselected collector current over a range of operating temperature from about 300° K. to about 76° K., the provision of signal amplication means consisting of an n-p-n silicon transistor selected such that it possesses a low temperature current gain peak at about 76° K., said transistor being neutron irradiated to a level such that at said preselected collector current said constant current gain is achieved.

4. In an amplifying circuit as in claim 3 a transistor of the type described whose p-region is diffused with gallium.

References Cited

UNITED STATES PATENTS 3,009,085 11/1961 Petritz ---------- 317—235

JAMES D. KALLAM, *Primary Examiner.*

JOHN W. HUCKERT, *Examiner.*

J. D. CRAIG, *Assistant Examiner.*